United States Patent
Londa

[19]

[11] Patent Number: 6,101,100

[45] Date of Patent: *Aug. 8, 2000

[54] MULTI-ELECTRONIC DEVICE PACKAGE

[75] Inventor: Joseph Michael Londa, Binghamton, N.Y.

[73] Assignee: International Business Machines Corporation, Armonk, N.Y.

[*] Notice: This patent is subject to a terminal disclaimer.

[21] Appl. No.: 09/330,170

[22] Filed: Jun. 11, 1999

Related U.S. Application Data

[63] Continuation of application No. 09/018,036, Feb. 3, 1998, Pat. No. 5,963,430, which is a continuation of application No. 08/685,253, Jul. 23, 1996, Pat. No. 5,748,452.

[51] Int. Cl.[7] .................. H05K 1/11; H05K 1/18
[52] U.S. Cl. .......... 361/761; 361/712; 361/719; 361/764; 361/803; 257/686; 257/707; 257/723; 257/738; 257/778
[58] Field of Search ................... 361/707, 711, 361/712, 719, 720, 721, 761, 764, 780, 790, 803; 257/685, 686, 707, 712, 713, 723, 738, 777, 778; 438/108, 121, 124–127; 439/68, 69, 485

[56] References Cited

U.S. PATENT DOCUMENTS

| | | | |
|---|---|---|---|
| 3,436,603 | 4/1969 | Vogt | 361/711 |
| 4,807,021 | 2/1989 | Okumura | 257/777 |
| 4,867,235 | 9/1989 | Grapes et al. | 165/185 |
| 4,933,810 | 6/1990 | Cardashian et al. | 361/749 |
| 4,953,060 | 8/1990 | Lauffer et al. | 361/710 |
| 4,991,000 | 2/1991 | Bone et al. | 257/686 |
| 5,060,844 | 10/1991 | Behun et al. | 228/180.21 |
| 5,099,309 | 3/1992 | Kryzaniwsky | 257/713 |
| 5,128,831 | 7/1992 | Fox, III et al. | 361/735 |
| 5,130,894 | 7/1992 | Miller | 361/735 |
| 5,172,303 | 12/1992 | Bernardoni et al. | 361/744 |
| 5,222,014 | 6/1993 | Lin | 361/792 |
| 5,241,133 | 8/1993 | Mullen, III et al. | 174/52.4 |
| 5,241,450 | 8/1993 | Bernhardt et al. | 361/689 |
| 5,241,456 | 8/1993 | Marcinkiewicz et al. | 361/761 |
| 5,247,423 | 9/1993 | Lin et al. | 361/719 |
| 5,299,094 | 3/1994 | Nishino et al. | 361/784 |
| 5,307,240 | 4/1994 | McMahon | 257/690 |
| 5,313,366 | 5/1994 | Gaudenzi et al. | 361/760 |
| 5,376,825 | 12/1994 | Tukamoto et al. | 257/685 |
| 5,391,917 | 2/1995 | Gilmour et al. | 257/690 |
| 5,394,010 | 2/1995 | Tazawa et al. | 257/686 |
| 5,394,300 | 2/1995 | Yoshimura | 361/737 |

(List continued on next page.)

FOREIGN PATENT DOCUMENTS

| | | | |
|---|---|---|---|
| 63-261736 | 10/1988 | Japan | 257/723 |
| 1-24446 | 1/1989 | Japan . | |
| 4-177870 | 6/1992 | Japan | 257/690 |
| 5-183103 | 7/1993 | Japan | 257/686 |

OTHER PUBLICATIONS

Dip Storage Module with Stacked Chips, Schmieg, J.W., *IBM Technical Disclosure Bulletin*, vol. 23, No. 6, Nov. 1980, p. 2337.

*Primary Examiner*—Leo P. Picard
*Assistant Examiner*—John B. Vigushin
*Attorney, Agent, or Firm*—Pollock, Vande Sande & Amernick; Lawrence R. Fraley

[57] ABSTRACT

An improved multi-electronic device package for accommodating multiple electronic devices such as integrated circuits, memory chips, or the like, is disclosed. The package includes a thermally and electrically conductive plane positioned between a first substrate and a second substrate. A first electronic device is secured to a first surface of the plane within an opening in the first substrate, and a second electronic device is secured to an opposed second surface of the plane within an opening in the second substrate. The electronic device package includes solder balls attached to the second substrate for electrically coupling and physically attaching the electronic device package to a third circuitized substrate, and solder balls attached to the first substrate for electrically coupling and physically attaching the electronic device package to a second electronic device package in a stacked configuration.

25 Claims, 6 Drawing Sheets

U.S. PATENT DOCUMENTS

| | | | |
|---|---|---|---|
| 5,397,917 | 3/1995 | Ommen et al. | 257/698 |
| 5,412,538 | 5/1995 | Kikinis et al. | 361/792 |
| 5,421,081 | 6/1995 | Sakaguchi et al. | 29/840 |
| 5,422,435 | 6/1995 | Takiar et sl. | 174/52.4 |
| 5,454,160 | 10/1995 | Nickel | 29/840 |
| 5,579,207 | 11/1996 | Hayden et al. | 361/790 |
| 5,615,089 | 3/1997 | Yoneda et al. | 361/764 |
| 5,633,783 | 5/1997 | Yamamoto | 257/686 |
| 5,642,265 | 6/1997 | Bond et al. | 361/807 |
| 5,739,581 | 4/1998 | Chillara et al. | 257/738 |
| 5,783,870 | 7/1998 | Mostafazadeh et al. | 257/686 |
| 5,798,564 | 8/1998 | Eng et al. | 257/686 |
| 5,920,117 | 7/1999 | Sono et al. | 257/675 |

MULTI-ELECTRONIC DEVICE PACKAGE

This application is a continuation of U.S. patent application Ser. No. 09/018,036 filed Feb. 3, 1998 U.S. Pat. No. 5,963,430, which is a continuation of U.S. patent application Ser. No. 08/685,253 filed Jul. 23, 1996 U.S. Pat. No. 5,748,452.

FIELD OF THE INVENTION

This invention relates to electronic device packages for multiple electronic devices, such as integrated circuits, memory chips, or the like.

BACKGROUND OF THE INVENTION

Multiple chip module (MCM) designs have responded to the need for increasing the number of electronic devices, such as integrated circuits or memory chips, within smaller areas. Initially, MCM technology connected chips or dies in an unpackaged, bare form in an XY plane and not along a Z axis. MCM technology has now allowed the interconnection and stacking of bare chips along the Z axis. Three-dimensional MCM packaging of this type offers higher chip density and less required interconnect density than two-dimensional multiple chip substrates. For an example of one such three-dimensional multi-chip module, see U.S. Pat. No. 5,222,014. While such designs have greatly improved chip density, further refinements in such designs are needed to improve the management of heat and also to further reduce the profile of the multi-chip module, in other words, to further increase chip density while managing and dissipating the heat generated from the multiple chips.

Another disadvantage of two-dimensional MCMs occurs during burn-in. Burn-in is performed to screen out weak chips or dice and validate that each die in a MCM is a known good die (KGD). If a two-dimensional MCM fails during burn-in, the entire module must be discharged or repaired using a costly removal procedure wherein the defective die is removed and replaced with a known good die. Thus, as the number of dice in a two-dimensional MCM increases, the yield for functional modules decreases. By stacking two-dimensional MCMs to create a three-dimensional MCM, each two-dimensional MCM layer can be tested and burned in separately to validate that each two-dimensional MCM layer and dice therein are known good. Thus, the resulting yields for functional three-dimensional modules are greater than two-dimensional modules having equivalent chip or circuit densities. Also, by performing burn-in at the MCM level, known good die testing of each die can be avoided.

SUMMARY OF THE INVENTION

Accordingly, the present invention is directed to a multi-electronic device package comprising a first substrate having a first surface and opposed second surface wherein the first substrate includes a first opening and a first layer of electrically conductive circuitry formed on the first surface of the first substrate. The electronic device package further includes a second substrate having a first surface and an opposed second surface wherein the second substrate includes a second opening and a second layer of electrically conductive circuitry formed on the second surface of the second substrate. A thermally and electrically conductive plane having a first surface and an opposed second surface is included. The plane is positioned between the first substrate and the second substrate and covers the first and second openings. A first electronic device is secured to the first surface of the plane such that the first electronic device is positioned within the first opening and wherein the first electronic device is electrically coupled to the first layer of circuitry. The electronic device package further includes a second electronic device secured to the second surface of the plane such that the second electronic device is positioned within the second opening. The second electronic device is electrically coupled to the second layer of circuitry, and the first layer of circuitry is electrically coupled to the second layer of circuitry. The first layer of circuitry is adapted for electrical coupling to a second electronic device package, and the second layer of circuitry is adapted for electrical coupling to a third external circuitized substrate.

The present invention is also directed to multi-electronic device package comprising a first substrate having a first surface and an opposed second surface wherein the first surface includes a first cavity extending from the first surface partially into the first substrate. A first layer of electrically conductive circuitry is formed on the first surface of the first substrate, and a second layer of electrically conductive circuitry is formed on the second surface of the first substrate wherein the second layer of circuitry is electrically coupled to the first layer of the circuitry and wherein the second layer of circuitry is adapted for electrical coupling to a third external circuitized substrate. The electronic device package further includes a first electronic device secured to the first substrate such that the first electronic device is positioned within the first cavity. The first electronic device is electrically coupled to the first layer of circuitry. A second substrate having a first surface and an opposed second surface is included, and a third layer of electrically conductive circuitry is formed on the second surface of the second substrate. The electronic device package further includes a second electronic device coupled to the second substrate wherein the second electronic device is electrically coupled to the third layer of circuitry and wherein the first and second substrates are bonded together along a common interface such that the second electronic device and the second surface of the second substrate faces the first electronic device and the first surface of the first substrate and wherein said first layer of circuitry is electrically coupled to the third layer of circuitry.

The present invention is also directed to a multi-electronic device package comprising a first substrate having a first surface and an opposed second surface; a first layer of electrically conductive circuitry formed on the first surface of the first substrate; a second layer of electrically conductive circuitry formed on the second surface of the first substrate wherein the second layer of circuitry is electrically coupled to said first layer of circuitry and wherein the second layer of circuitry is adapted for electrical coupling to a third external circuitized substrate. The electronic device package further comprises an electronic device secured to the first substrate and electrically coupled to the first layer of circuitry; a second substrate having a first surface and an opposed second surface; a third layer of electrically conductive circuitry formed on the first surface of the second substrate; a second electronic device coupled to the second substrate wherein the second electronic device is electrically coupled to the third layer of circuitry; a fourth layer of electrically conductive circuitry formed on the second surface of the second substrate wherein the fourth layer of circuitry is electrically coupled to the third layer of circuitry; and a first encapsulant covering the first electronic device and a portion of the first layer of circuitry. The second substrate includes a cavity extending from the second surface of the second substrate partially into the second substrate wherein the first and second substrates are bonded together along a common interface such that the second surface of the second substrate faces the first surface of the first substrate and at least a portion of the encapsulant extends into the cavity to thereby decrease the distance between the second surface of the second substrate and the first surface of the first substrate.

The primary advantage of the present invention is an improved multi-electronic device package design having increased chip density, lower overall profile, and greater heat dissipation performance than prior art multi-chip module designs.

Also, the present invention provides the advantage of avoiding the need for known good die (KGD) to manufacture MCMs.

DETAILED DESCRIPTION OF A PREFERRED EMBODIMENT OF THE INVENTION

Figure 1:
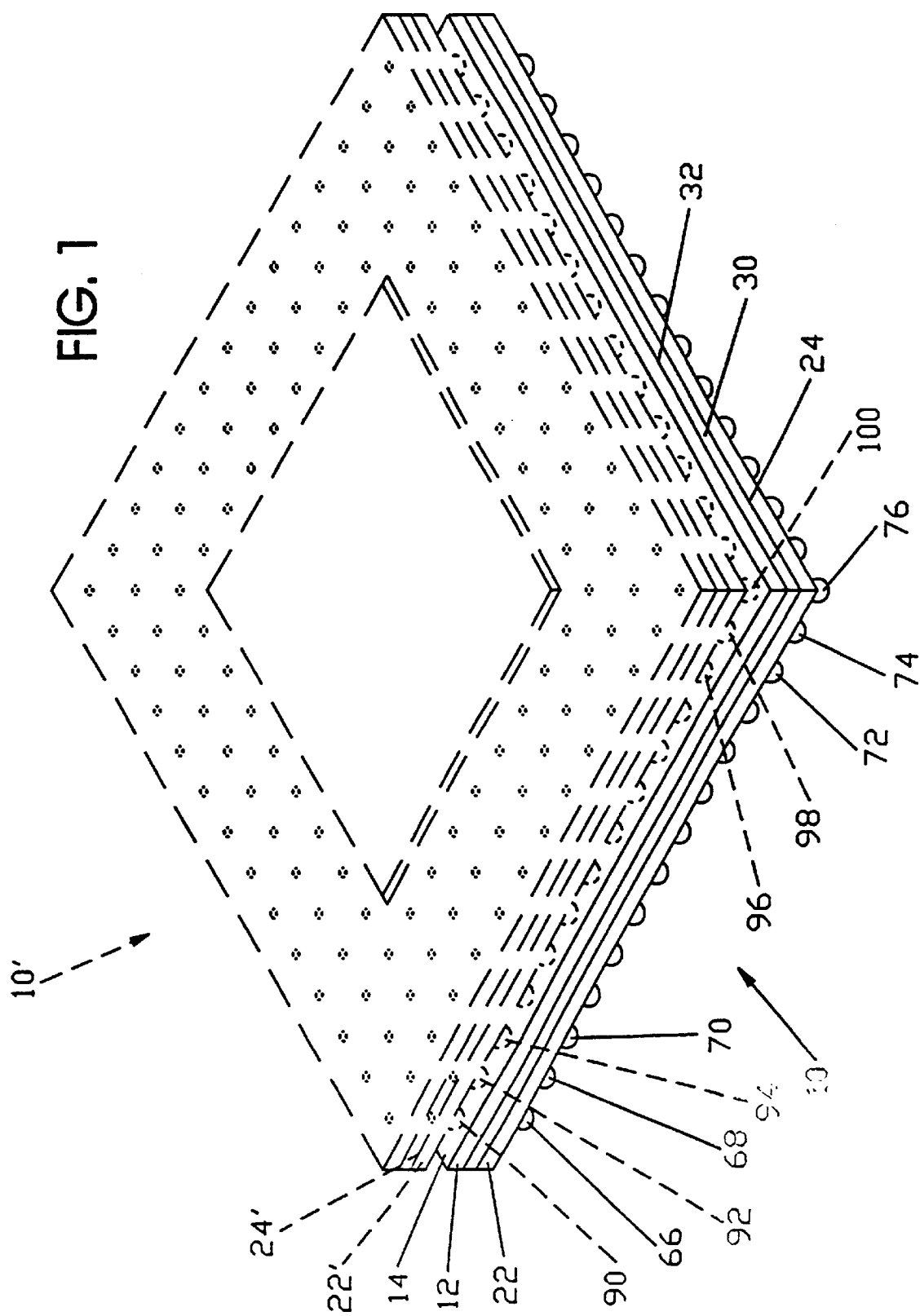
FIG. 1 is a perspective view of a multi-electronic device package according to the present invention.
Figure 2:
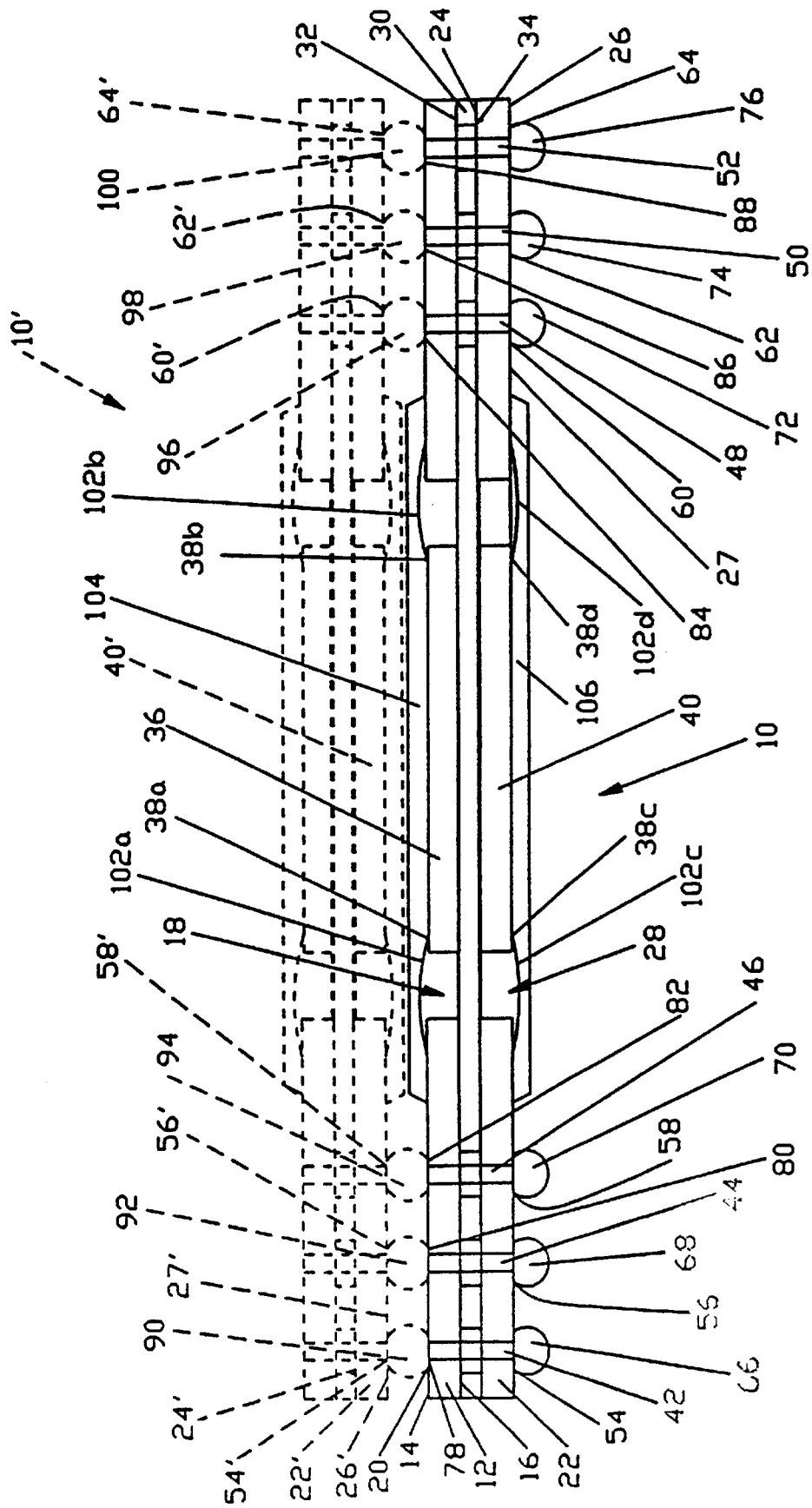
FIG. 2 is a cross-sectional view of the multi-electronic device package of FIG. 1.

Referring to FIGS. 1 and 2, a multi-electronic device package 10 according to the invention is shown. Multi-electronic device package 10 is also known as a ball grid array (BGA) package. Multi-electronic device package 10 includes a first substrate 12 having a first surface 14 and an opposed second surface 16. Substrate 12 is a dielectric material, i.e., a non-electrically conductive material such as a pre-preg comprising epoxy resin impregnated with glass fabric. First substrate 12 includes a first opening 18. A first layer of electrically conductive circuitry 20 is formed on first surface 14 of first substrate 12. Multi-electronic device package 10 further includes a second substrate 22 having a first surface 24 and an opposed second surface 26. Second substrate 22 is preferably also made from pre-preg comprising epoxy resin impregnated with glass fabric. The second substrate 22 includes a second opening 28. A thermally and electrically conductive plane 30 having a first substrate 32 and an opposed second surface 34 is provided. Plane 30 is positioned between first substrate 12 and second substrate 22 and covers first and second openings 18, 28. Plane 30 is preferably a copper foil sheet, but it will be appreciated that plane 30 may be constructed from other thermally and electrically conductive materials such as aluminum or the like. The first electronic device 36 is secured to first surface 32 of plane 30 such that first electronic device 36 is positioned within first opening 18. First electronic device 36 is electrically coupled to first layer of circuitry 20. First electronic device 36 may be any electrical based component, such as an integrated circuit, memory chip, and/or semiconductor die having contacts 38a, 38b.

A second electronic device 40 is secured to second surface 34 of plane 30 such that second electronic device 40 is positioned within second opening 28. Second electronic device 40 is electrically coupled to a second layer of circuitry 27 formed on second surface 34 of second substrate 22 via contacts 38c, 38d. First layer of circuitry 20 is electrically coupled to second layer of circuitry 27, and first layer of circuitry 20 is adapted for electrical coupling to a second electronic package 10'. Also, second layer of circuitry 27 is adapted for electrical coupling to a third external circuitized substrate (not shown). It will be appreciated that although second electronic package 10' is shown in phantom as being identical to multi-electronic device package 10, second electronic package 10' can take on various other forms such as those designs already described in the prior art and/or those designs to be described in FIGS. 3–6.

Still referring to FIGS. 1 and 2, multi-electronic device package 10 further comprises a plurality of plated through holes 42, 44, 46, 48, 50, 52 extending through first and second substrates 12, 22 and plane 30 for electrically coupling first and second layers of circuitry 20, 27. Second layer of circuitry 27 includes a plurality of solder ball pads 54, 56, 58, 60, 62, 64. Solder balls 66, 68, 70, 72, 74, 76 are coupled to or soldered to solder ball pads 54, 56, 58, 60, 62, 64, respectively, to electrically couple second layer of circuitry 27 to the third external circuitized substrate (not shown) as well known in the art. Second electronic package 10' includes, at a minimum, the following parts: a fourth substrate 22' having a first surface 24' and a second surface 26' opposed to first surface 24'; a third layer of electrically conductive circuitry 27' formed on second surface 26' of fourth substrate 22'; and a third electronic device 40' coupled to fourth substrate 22' and electrically coupled to third layer of circuitry 27'. Second electronic device package 10' is stacked on top of multi-electronic device package 10 and attached thereto. Third layer of circuitry 27' includes a plurality of solder ball pads 54', 56', 58', 60', 62', and 64'. First layer of circuitry 20 includes a corresponding solder ball pad 78, 80, 82, 84, 86, and 88 for each solder ball pad 54', 56', 58', 60', 62', and 64' of third layer of circuitry 27'. Solder balls 90, 92, 94, 96, 98, and 100 are coupled to each solder ball pad 54', 56', 58', 60', 62', and 64', respectively, and each corresponding solder ball pad 78, 80, 82, 84, 86, and 88 to attach multi-electronic package 10 to second electronic package 10' and to electrically couple first layer of circuitry 20 to third layer of circuitry 27'. Multi-electronic device package 10 further includes bond wires 102a, 102b, 102c, and 102d made of electrically conductive material, such as gold or copper. Bond wires 102a, 102b are coupled between contacts 38a, 38b of first electronic device 36 and first layer of circuitry 20 to electrically couple first electronic device 36 to first layer of circuitry 20. Bond wires 102c, 102d are coupled between contacts 38a, 38b of second electronic device 40 and second layer of circuitry 27 to electrically couple second electronic device 40 to the second layer of circuitry 27. Bond wires 102a, 102b, 102c, 102d may be coupled to contacts 38a, 38b, 38c, 38d and first and second layers of circuitry 20, 27 using known wire bonding techniques. Multi-electronic device package 10 further includes a first encapsulant 104 preferably made of epoxy resin for covering electronic device 36, bond wires 102a, 102b and a portion of first layer of circuitry 20 and a second encapsulant 106 preferably made of an epoxy resin for covering second electronic device 40, bond wires 102c, 102d, and a portion of second layer of circuitry 27. First encapsulant 104 may be bound to an encapsulant associated with second electronic package 10' to physically couple first electronic package 10 to second electronic package 10'. Although not shown, it will be appreciated that first and second encapsulant 104, 106 may take the form of a single integral encapsulant which wraps around first electronic package 10.

Figure 3:
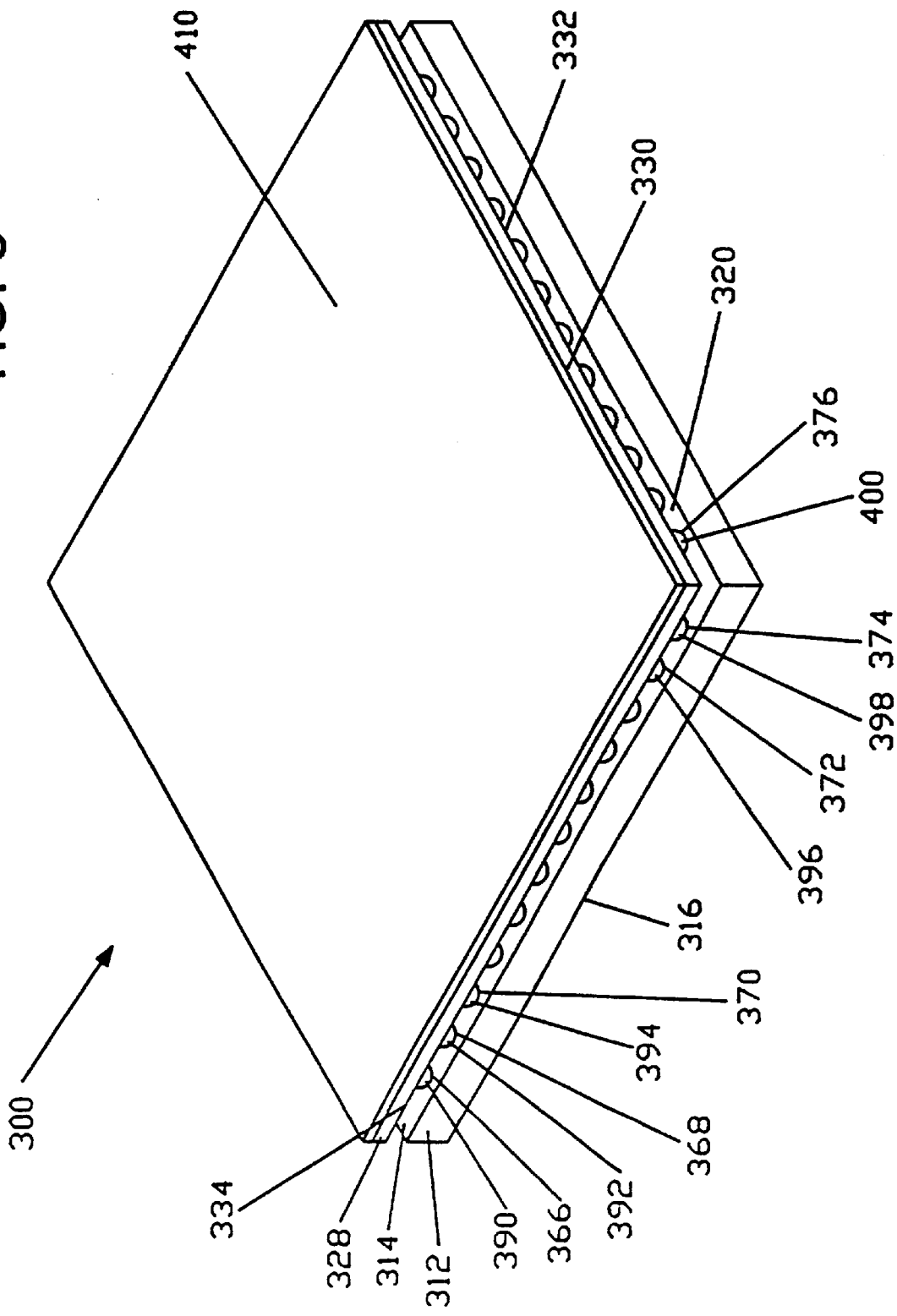
FIG. 3 is a perspective view of an alternative embodiment of a multi-electronic device package according to the present invention.
Figure 4:
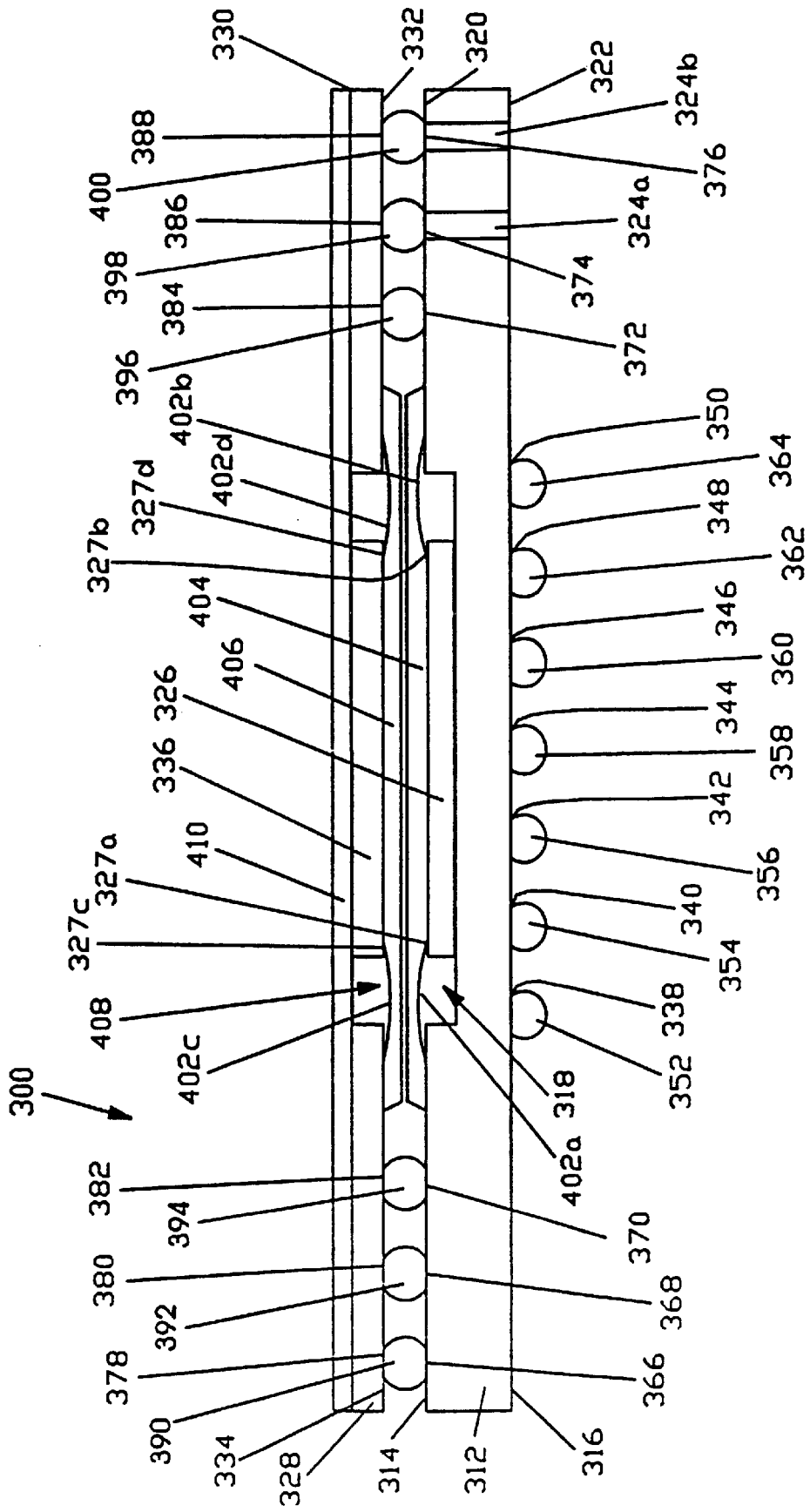
FIG. 4 is a cross-sectional view of the multi-electronic device package of FIG. 3.

Referring now to FIGS. 3 and 4, a second alternative embodiment of a multi-electronic device package 300 according to the present invention is shown. Multi-electronic device package 300 includes a first substrate 312 having a first surface 314 and opposed second surface 316. First surface 314 includes a first cavity 318 extending from first surface 314 partially into first substrate 312. A first layer of electrically conductive circuitry 320 is formed on first surface 314 of first substrate 312. A second layer of electrically conductive circuitry 322 is formed on second surface 316 of first substrate 312, wherein second layer of circuitry 322 is electrically coupled to first layer of circuitry 320 via one or more plated through holes 324a, 324b. Second layer of circuitry 322 is adapted for electrical coupling to a third external circuitized substrate (not shown). A first electronic device 326 is secured to first substrate 312 such that first electronic device 326 is positioned within first cavity 318. First electronic device 326 is electrically coupled to first layer of circuitry 320 via contacts 327a, 327b. Multi-electronic device package 300 further includes a second substrate 328 having a first surface 330 and opposed second surface 332. As in multi-electronic device package 10 of FIGS. 1 and 2, first and second substrates 312, 328 are preferably pre-preg comprising epoxy resin impregnated with glass fabric. A third layer of electrically conductive circuitry 334 is formed on second surface 332 of second substrate 328. A second electronic device 336 having contacts 327c, 327d is coupled to second substrate 328. Second electronic device 336 is electrically coupled to third layer of electrically conductive circuitry 334. First and second substrates 312, 328 are bonded together along a common interface such that the second electronic device 336 and the second surface 332 of second substrate 328 face first electronic device 326 and first surface 314 of first substrate 312, and wherein first layer of circuitry 320 is electrically coupled to third layer of circuitry 334. Plated through holes 324a, 324b extend through first substrate 312 and electrically couple first and second layers of circuitry 320, 322. Second layer of circuitry 322 includes a plurality of solder ball pads 338, 340, 342, 344, 346, 348, and 350.

Multi-electronic device package 300 further comprises solder balls 352, 354, 356, 358, 360, 362, 364 coupled to each solder ball pad 338, 340, 342, 344, 346, 348, 350, respectively, for electrically coupling second layer of circuitry 322 to the third external circuitized substrate (not shown). First layer of circuitry 320 includes a plurality of solder ball pads 366, 368, 370, 372, 374, 376. Third layer of circuitry 334 includes corresponding solder ball pads 378, 380, 382, 384, 386, 388 for each solder ball pad 366, 368, 370, 372, 374, 376 of first layer of circuitry 320. Solder balls 390, 392, 394, 396, 398, and 400 are coupled to each solder ball pad 366, 368, 370, 372, 374, and 376 and corresponding solder ball pad 378, 380, 382, 384, 386, and 388, respectively, to attach first substrate 312 to second substrate 328 along a common interface and to electrically couple first layer of circuitry 320 to third layer of circuitry 334. Bond wires 402a, 402b are wire bonded between contacts 327a, 327b of first electronic device 326 and first layer of circuitry 320. Bond wires 402c, 402d are wire bonded between contacts 327c, 327d of second electronic device 336 and third layer of circuitry 334. In this manner, first electronic device 326 is electrically coupled to first layer of circuitry 320, and second electronic device 336 is electrically coupled to third layer of circuitry 334. Multi-electronic device package 300 further includes a first encapsulant 404, preferably made of epoxy resin, covering first electronic device 326, first cavity 318, bond wires 402a, 402b, and at least a portion of first circuitry 320, and a second encapsulant 406, preferably made from epoxy resin, covering second electronic device 336, bond wires 402c, 402d, and at least a portion of the third layer of circuitry 334. First encapsulant 404 is bonded to second encapsulant 406 to attach first substrate 312 to second substrate 328. Second substrate 328 further includes an opening 408 and a thermally conductive plane 410 coupled to first surface 330 of second substrate 328 and covering opening 408. Second electronic device 336 is attached to thermally conductive plane 410 within opening 408. In this manner, second electronic device 336 is coupled to second substrate 328 via plane 410. Plane 410 dissipates heat generated from first and second electronic devices 326, 336. Additionally, substrates 312, 328 may further include embedded thermally and/or electrically conductive planes.

Figure 5:
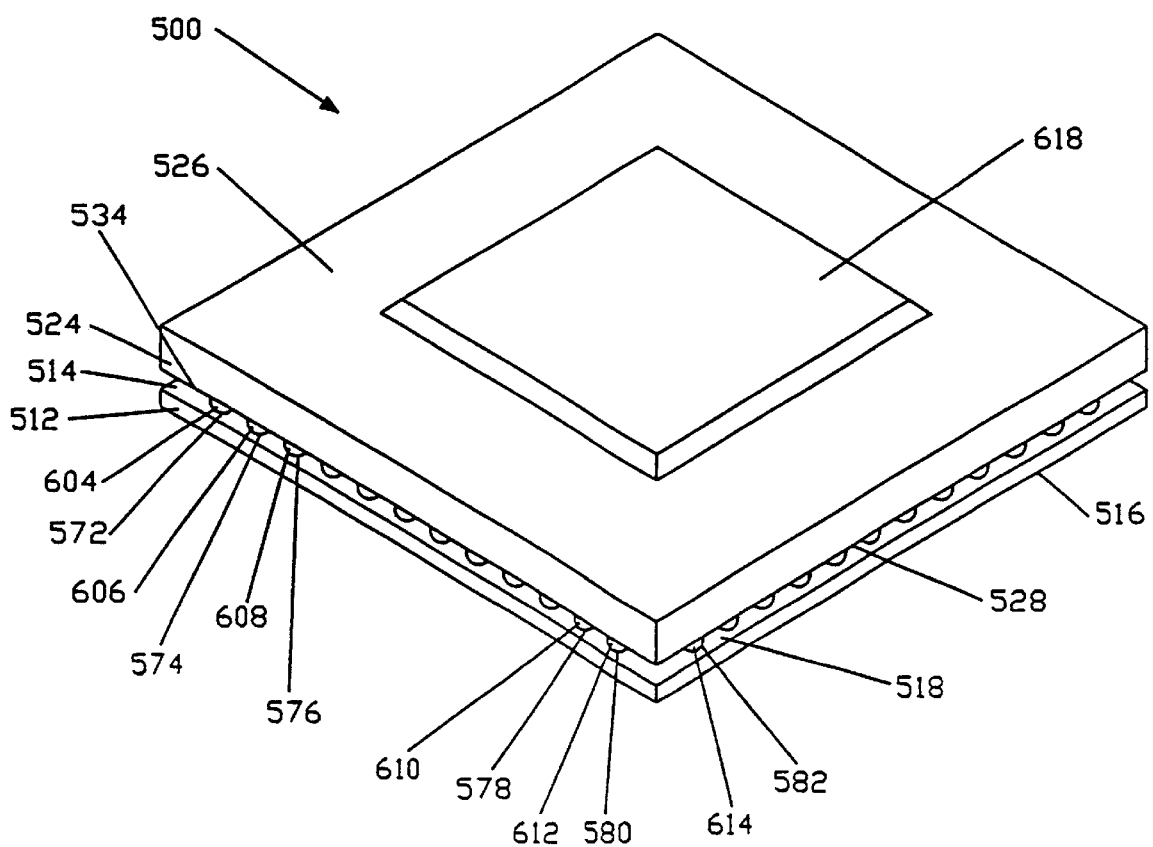
FIG. 5 is a perspective view of a second alternative embodiment of a multi-electronic device package according to the present invention.
Figure 6:
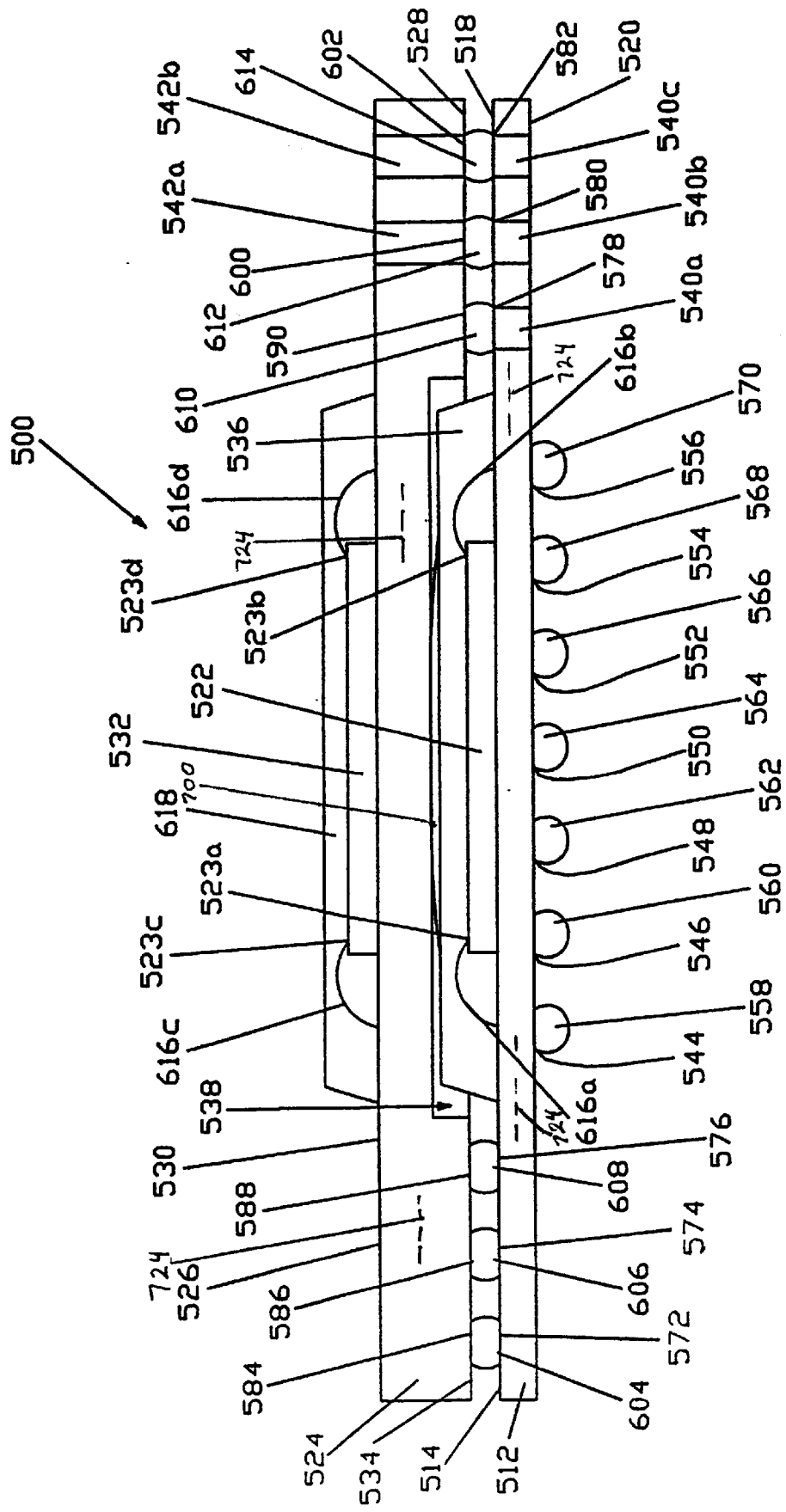
FIG. 6 is a cross-sectional view of the multi-electronic device package of FIG. 5.

Referring now to FIGS. 5 and 6, a second alternative embodiment of a multi-electronic device package 500 according to the present invention is shown. Multi-electronic device package 500 comprises a first substrate 512 having a first surface 514 and an opposed second surface 516. A first layer of electrically conductive circuitry 518 is formed on first surface 514 of first substrate 512. A second layer of electrically conductive circuitry 520 is formed on second surface 516 of first substrate 512, wherein second layer of circuitry 520 is electrically coupled to first layer of circuitry 518, and wherein second layer of circuitry 520 is adapted for electrical coupling to a third external circuitized substrate (not shown). A first electronic device 522 having contacts 523a, 523b is secured to first substrate 512 and electrically coupled to first layer of circuitry 518. A second substrate 524 having a first surface 526 and a second surface 528 is also included. A third layer of electrically conductive circuitry 530 is formed on first surface 526 of second substrate 524. The second electronic device 532 having contacts 523c, 523d is coupled to second substrate 524 and is electrically coupled to third layer of circuitry 530. A fourth layer of electrically conductive circuitry 534 is formed on second surface 528 of second substrate 524, wherein fourth layer of circuitry 534 is electrically coupled to third layer of circuitry 530. Multi-electronic device package 500 includes a first encapsulant 536, preferably made from epoxy resin, covering first electronic device 522 and a portion of first layer of circuitry 518. Second substrate 524 includes a cavity 538 extending from second surface 528 of second substrate 524 partially into second substrate 524. First and second substrates 512, 524 are bonded together along a common interface such that second surface 528 of second substrate 524 faces first surface 514 of first substrate 512. At least a portion of first encapsulant 536 extends into cavity 538 to thereby decrease the distance between second surface 528 of second substrate 524 and first surface 514 of first substrate 512.

Multi-electronic device package 500 further comprises at least one plated through hole 540a, 540b, 540c extending through first substrate 512 for electrically coupling first and second layers of circuitry 518, 520. Additionally, electronic device package 500 further comprises at least one plated through hole 542a, 542b extending through second substrate 524 for electrically coupling third and fourth layers of circuitry 530, 534. Second layer of circuitry 520 includes a plurality of solder ball pads 544, 546, 548, 550, 552, 554, 556. Solder balls 558, 560, 562, 564, 566, 568, 570 are coupled to each solder ball pad 544, 546, 548, 550, 552, 554, 556, respectively, for electrically coupling second layer of circuitry 520 to the third external circuitized substrate and for physically attaching multi-electronic device package 500 to the third external circuitized substrate. The first layer of circuitry 518 includes a plurality of solder ball pads 572, 574, 576, 578, 580, 582. Fourth layer of circuitry 534 includes a corresponding solder ball pad 584, 586, 588, 590, 600, 602 for each solder ball pad 572, 574, 576, 578, 580, 582 of first layer of circuitry 518. Solder balls 604, 606, 608, 610, 612, and 614 are coupled to each solder ball pad 572, 574, 576, 578, 580, 582 and corresponding solder ball pad 584, 586, 588, 590, 600, 602 to attach first substrate 512 to second substrate 524 along a common interface and to electrically couple first layer of circuitry 518 to fourth layer of circuitry 534.

First encapsulant 536 is bonded to second substrate 524 and specifically to cavity 538. Although not shown, first and second substrates 512, 524 include thermally conductive and electrically conductive planes encapsulated therein. These planes dissipate heat produced by first electronic device 522 and second electronic device 532. Bond wires 616a, 616b are wire bonded between contacts 523a, 523b of first electronic device 522 and first layer of circuitry 518 to electrically couple first electronic device 522 to first layer of circuitry 518. Also, bond wires 616c, 616d are wire bonded between contacts 523c, 523d of second electronic device 532 and third layer of circuitry 530 to electrically couple second electronic device 532 to first layer of circuitry 530. First encapsulant 536 additionally covers bond wires 616a, 616b connected between first electronic device 522 and first layer of circuitry 518. A second encapsulant 618, made from epoxy resin, covers second electronic device 532, at least a portion of third layer of circuitry 530, and those bond wires 616c, 616d electrically coupling second electronic device 532 to third layer of circuitry 530.

Although the present invention and its advantages have been described in detail, it should be understood that various changes, substitutions and alterations can be made herein without departing from the spirit or scope of the invention as defined in the appended claims.

What is claimed is:

1. A multi-electronic device package comprising a first electronic device package comprising:
   a first substrate having a first surface and opposed second surface, said first substrate including a first opening;
   a first layer of electrically conductive circuitry formed on said first surface of said first substrate;
   a second substrate having a first surface and an opposed second surface, said second substrate including a second opening;
   a second layer of electrically conductive circuitry formed on said second surface of said second substrate;
   a thermally and electrically conductive plane having a first surface and an opposed second surface, said plane being positioned between said first substrate and said second substrate and covering said first and second openings;
   a first electronic device secured to said first surface of said plane such that said first electronic device is positioned within said first opening, said first electronic device electrically coupled to said first layer of circuitry;
   a second electronic device secured to said second surface of said plane such that said second electronic device is positioned within said second opening, said second electronic device electrically coupled to said second layer of circuitry and wherein said first layer of circuitry is electrically coupled to said second layer of circuitry and wherein said first layer of circuitry is adapted for electrical coupling to a second electronic device package and said second layer of circuitry is adapted for electrical coupling to a third external circuitized substrate, and
   further comprising at least one plated-through hole extending through said first and second substrates for electrically coupling said first and second layers of circuitry.

2. The multi-electronic device package as recited in claim 1, further comprising a second electronic package comprising:
   a fourth substrate having a first surface and an opposed second surface;
   a third layer of electrically conductive circuitry formed on said surface of said fourth substrate; and
   a third electronic device coupled to said fourth substrate and electrically coupled to said third layer of circuitry.

3. The multi-electronic device package as recited in claim 2, wherein said second electronic device package is stacked on top of said first electronic device package and attached thereto.

4. A multi-electronic device package comprising:
   a first substrate having a first surface and opposed second surface, said first substrate including a first opening;
   a first layer of electrically conductive circuitry formed on said first surface of said first substrate;
   a second substrate having a first surface and an opposed second surface, said second substrate including a second opening;
   a second layer of electrically conductive circuitry formed on said second surface of said second substrate;
   a thermally and electrically conductive plane having a first surface and an opposed second surface, said plane being positioned between said first substrate and said second substrate and covering said first and second openings;
   a first electronic device secured to said first surface of said plane such that said first electronic device is positioned within said first opening, said first electronic device electrically coupled to said first layer of circuitry;
   a second electronic device secured to said second surface of said plane such that said second electronic device is positioned within said second opening, said second electronic device electrically coupled to said second layer of circuitry and wherein said first layer of circuitry is electrically coupled to said second layer of circuitry and wherein said first layer of circuitry is adapted for electrical coupling to a second electronic device package and said second layer of circuitry is adapted for electrical coupling to a third external circuitized substrate, and
   wherein said second layer of circuitry includes a plurality of solder ball pads .

5. The multi-electronic device package as recited in claim 4, further comprising a solder ball coupled to each said solder ball pad for electrically coupling said second layer of circuitry to the third external circuitized substrate.

6. A multi-electronic device package comprising:
   a first substrate having a first surface and opposed second surface, said first substrate including a first opening;
   a first layer of electrically conductive circuitry formed on said first surface of said first substrate;
   a second substrate having a first surface and an opposed second surface, said second substrate including a second opening;

a second layer of electrically conductive circuitry formed on said second surface of said second substrate;

a thermally and electrically conductive plane having a first surface and an opposed second surface, said plane being positioned between said first substrate and said second substrate and covering said first and second openings;

a first electronic device secured to said first surface of said plane such that said first electronic device is positioned within said first opening, said first electronic device electrically coupled to said first layer of circuitry;

a second electronic device secured to said second surface of said plane such that said second electronic device is positioned within said second opening, said second electronic device electrically coupled to said second layer of circuitry and wherein said first layer of circuitry is electrically coupled to said second layer of circuitry and wherein said first layer of circuitry is adapted for electrical coupling to a second electronic device package and said second layer of circuitry is adapted for electrical coupling to a third external circuitized substrate, and further comprising a second electronic package comprising:

a fourth substrate having a first surface and an opposed second surface;

a third layer of electrically conductive circuitry formed on said second surface of said fourth substrate; and a third electronic device coupled to said fourth substrate and electrically coupled to said third layer of circuitry;

wherein said second electronic device package is stacked on top of said first electronic package device and attached thereto; and wherein said third layer of circuitry includes a plurality of solder ball pads.

7. The multi-electronic device package as recited in claim 6, wherein said first layer of circuitry includes a corresponding solder ball pad for each said solder ball pad of said third layer of circuitry.

8. The multi-electronic device package as recited in claim 7, further comprising a solder ball coupled to each said solder ball pad and corresponding solder ball pad to attach said first and second electronic device packages and to electrically couple said first layer of circuitry to said third layer of circuitry.

9. A multi-electronic device package comprising:

a first substrate having a first surface and an opposed second surface, said first surface including a first cavity extending from said first surface partially into said first substrate;

a first layer of electrically conductive circuitry formed on said first surface of said first substrate; wherein said first layer of circuitry includes a plurality of solder ball pads;

a second layer of electrically conductive circuitry formed on said second surface of said first substrate wherein said second layer of circuitry is electrically coupled to said first layer of circuitry and wherein said second layer of circuitry is adapted for electrical coupling to a third external circuitized substrate;

a first electronic device secured to said first substrate such that said first electronic device is positioned within said first cavity, said first electronic device electrically coupled to said first layer of circuitry;

a second substrate having a first surface and an opposed second surface;

a third layer of electrically conductive circuitry formed on said second surface of said second substrate;

a second electronic device coupled to said second substrate, said second electronic device electrically coupled to said third layer of circuitry; and wherein said first and second substrates are bonded together along a common interface such that said second electronic device and said second surface of said second substrate faces said first electronic device and said first surface of said first substrate, and wherein said first layer of circuitry is electrically coupled to said third layer of circuitry.

10. The multi-electronic device package as recited in claim 9, further comprising at least one plated-through hole extending through said first substrate for electrically coupling a said first and second layers of circuitry.

11. The multi-electronic device package as recited in claim 9, wherein said second layer of circuitry includes a plurality of solder ball pads.

12. The multi-electronic device package as recited in claim 11, further comprising a solder ball coupled to each said solder ball pad for electrically coupling said second layer of circuitry to the third external circuitized substrate.

13. The multi-electronic device package as recited in claim 9, wherein said third layer of circuitry includes a corresponding solder ball pad for each said solder ball pad of said first layer of circuitry.

14. The multi-electronic device package as recited in claim 13, further comprising a solder ball coupled to each solder ball pad and corresponding solder ball pad to attach said first substrate to said second substrate along said common interface and to electrically couple said first layer of circuitry to said third layer of circuitry.

15. A multi-electronic device package comprising:

a first substrate having a first surface and an opposed second surface, said first surface including a first cavity extending from said first surface partially into said first substrate;

a first layer of electrically conductive circuitry formed on said first surface of said first substrate;

a second layer of electrically conductive circuitry formed on said second surface of said first substrate wherein said second layer of circuitry is electrically coupled to said first layer of circuitry and wherein said second layer of circuitry is adapted for electrical coupling to a third external circuitized substrate;

a first electronic device secured to said first substrate such that said first electronic device is positioned within said first cavity, said first electronic device electrically coupled to said first layer of circuitry;

a second substrate having a first surface and an opposed second surface;

a third layer of electrically conductive circuitry formed on said second surface of said second substrate;

a second electronic device coupled to said second substrate, said second electronic device electrically coupled to said third layer of circuitry; and wherein said first and second substrates are bonded together along a common interface such that said second electronic device and said second surface of said second substrate faces said first electronic device and said first surface of said first substrate, and wherein said first layer of circuitry is electrically coupled to said third layer of circuitry; and wherein said second substrate includes an opening.

16. The multi-electronic device package as recited in claim 15, further comprising a thermally conductive plane coupled to said first surface of said second substrate and covering said opening.

17. The multi-electronic device package as recited in claim 16, wherein said second electronic device is secured to said plane within said opening.

18. A multi-electronic device package comprising:

a first substrate having a first surface and opposed second surface;

a first layer of electrically conductive circuitry formed on said first surface of said first substrate;

a second layer of electrically conductive circuitry formed on said second surface of said first substrate, wherein said second layer of circuitry is electrically coupled to said first layer of circuitry, and wherein said second layer of circuitry is adapted for electrical coupling to a third external circuitized substrate;

a first electronic device secured to said first substrate and electrically coupled to said first layer of circuitry;

a second substrate having a first surface and an opposed second surface;

a third layer of electrically conductive circuitry formed on said first surface of said second substrate;

a second electronic device coupled to said second substrate, said second electronic device electrically coupled to said third layer of circuitry;

a fourth layer of electrically conductive circuitry formed on said second surface of said second substrate, wherein said fourth layer of circuitry is electrically coupled to said third layer of circuitry;

a first encapsulant covering said first electronic device and a portion of said first layer of circuitry; and wherein said second substrate includes a cavity extending from said second surface of said second substrate partially into said second substrate, and wherein said first and second substrates are bonded together along a common interface such that said second surface of said second substrate faces said first surface of said first substrate and at least a portion of said encapsulant extends into said cavity to thereby decrease the distance between said second surface of said second substrate and said first surface of said first substrate;

and further comprising at least one plated-through hole extending through said first substrate for electrically coupling said first and second layers of circuitry.

19. The multi-electronic device package as recited in claim 18, further comprising at least one plated-through hole extending through said second substrate for electrically coupling said third and fourth layers of circuitry.

20. The multi-electronic device package as recited in claim 18, wherein said second layer of circuitry includes a plurality of solder ball pads.

21. The multi-electronic device package as recited in claim 20, further comprising a solder ball coupled to each said solder ball pad for electrically coupling said second layer of circuitry to the third external circuitized substrate.

22. The multi-electronic device package as recited in claim 18, wherein said first layer of circuitry includes a plurality of solder ball pads.

23. The multi-electronic device package as recited in claim 22, wherein said fourth layer of circuitry includes a corresponding solder ball pad for each said solder ball pad of said first layer of circuitry.

24. The multi-electronic device package as recited in claim 23, further comprising a solder ball coupled to each said solder ball pad and corresponding solder ball pad to attach said first substrate to said second substrate along said common interface and to electrically couple said first layer of circuitry to said fourth layer of circuitry.

25. The multi-electronic device package as recited in claim 18, wherein said first and second substrates include a thermally conductive and electrically conductive plane encapsulated therein.

* * * * *

UNITED STATES PATENT AND TRADEMARK OFFICE
CERTIFICATE OF CORRECTION

PATENT NO. : 6,101,100
DATED : August 8, 2000
INVENTOR(S) : Joseph Michael Londa It is certified that error appears in the above-identified patent and that said Letters Patent is hereby corrected as shown below:

Col. 10, line 16, delete ``a''.

Signed and Sealed this

Seventeenth Day of April, 2001

*Attest:*

NICHOLAS P. GODICI

*Attesting Officer*     *Acting Director of the United States Patent and Trademark Office*